(12) United States Patent
Asano

(10) Patent No.: US 7,635,872 B2
(45) Date of Patent: Dec. 22, 2009

(54) SEMICONDUCTOR LAYER, PROCESS FOR FORMING THE SAME, AND SEMICONDUCTOR LIGHT EMITTING DEVICE

(75) Inventor: Hideki Asano, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 329 days.

(21) Appl. No.: 11/730,472

(22) Filed: Apr. 2, 2007

(65) Prior Publication Data
US 2007/0228408 A1 Oct. 4, 2007

(30) Foreign Application Priority Data
Mar. 31, 2006 (JP) ............................. 2006-096944
Feb. 22, 2007 (JP) ............................. 2007-042238

(51) Int. Cl.
*H01L 33/00* (2006.01)
*H01L 21/00* (2006.01)
(52) U.S. Cl. .......................................... 257/87; 438/22
(58) Field of Classification Search ............. 257/15–22, 257/87, 94, E29.344; 438/22, 24
See application file for complete search history.

(56) References Cited

U.S. PATENT DOCUMENTS 6,242,761 B1 * 6/2001 Fujimoto et al. .............. 257/94
6,479,836 B1 * 11/2002 Suzuki et al. .................. 257/15

FOREIGN PATENT DOCUMENTS

| JP | 64-17484 A | 1/1989 |
|---|---|---|
| JP | 5-206513 A | 8/1993 |

OTHER PUBLICATIONS

T. Takano et al., "Room-temperature deep-ultraviolet lasing at 241.5 nm of AlGaN multiple-quantum-well laser," Applied Physics Letters, 2004, pp. 3567-3569, vol. 84, No. 18.

* cited by examiner

*Primary Examiner*—Calvin Lee
(74) *Attorney, Agent, or Firm*—Sughrue Mion, PLLC

(57) ABSTRACT

A semiconductor layer contains, as a principal constituent, a Groups III-V semiconductor compound, which may be represented by the general formula: $B_xAl_yGa_zN$, wherein x represents a number satisfying the condition $0<x<1$, y represents a number satisfying the condition $0 \leq y<1$, and z represents a number satisfying the condition $0<z<1$, with the proviso that $x+y+z=1$, the semiconductor layer having been formed with a laser assisted metalorganic vapor phase epitaxy technique. A semiconductor light emitting device comprises the semiconductor layer and may be constituted as a semiconductor laser or a light emitting diode.

4 Claims, 3 Drawing Sheets

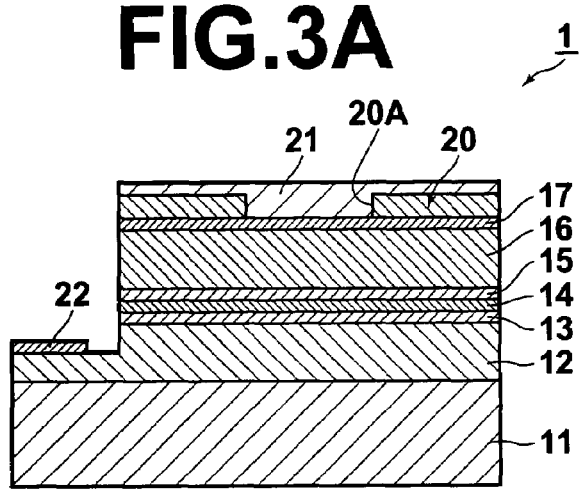
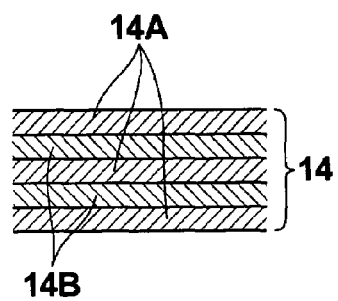
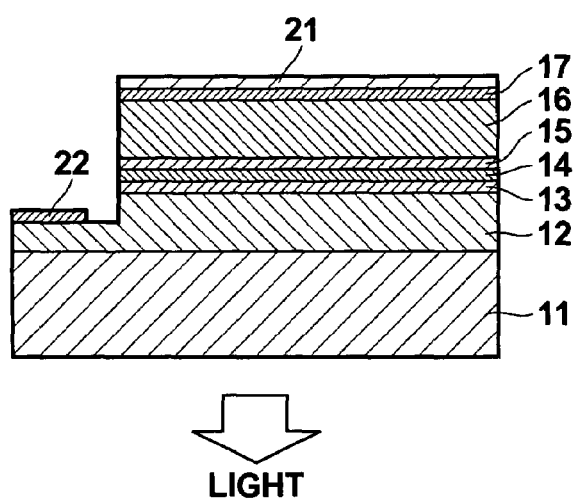

SEMICONDUCTOR LAYER, PROCESS FOR FORMING THE SAME, AND SEMICONDUCTOR LIGHT EMITTING DEVICE

BACKGROUND OF THE INVENTION

1. Field of the Invention

This invention relates to a semiconductor layer containing, as a principal constituent, a Groups III-V semiconductor compound, which may be represented by the general formula $B_xAl_yGa_zN$, wherein x represents a number satisfying the condition $0<x<1$, y represents a number satisfying the condition $0 \leq y<1$, and z represents a number satisfying the condition $0<z<1$, with the proviso that $x+y+z=1$. This invention also relates to a process for forming the semiconductor layer. This invention further relates to a semiconductor light emitting device, which comprises the semiconductor layer.

2. Description of the Related Art

In recent years, GaN type materials have been developed, and rapid advances have been made in semiconductor light emitting devices, such as semiconductor lasers and light emitting diodes, which are capable of producing light having short wavelengths. Nowadays, semiconductor light emitting devices, which are capable of producing light having a wavelength of as short as 365 nm, have been accomplished. Also, nowadays, extensive studies are being conducted on semiconductor light emitting devices, which are capable of producing light having a shorter wavelength.

One of semiconductor light emitting devices, which are greatly expected to be appropriate as ultraviolet semiconductor light emitting devices, is an AlGaN type semiconductor light emitting device, in which a GaN base plate is used as a base plate, and in which a mixed crystal material of GaN with AlN or with AlInN (specifically, an AlGaN mixed crystal or an AlGaInN mixed crystal) is caused to grow on the GaN base plate. For example, it has been reported that, with a device structure of a GaN base plate/AlGaN type quantum well structure, production of a laser beam having a wavelength of approximately 240 nm is capable of being achieved though with light excitation. The report is made in, for example, "Room-temperature deep-ultraviolet lasing at 241.5 nm of AlGaN multiple-quantum-well laser", T. Takano et al., Applied Physics Letters, Vol. 84, No. 18, pp. 3567-3569, 2004.

However, under existing circumstances, there is no prospect of use of ultraviolet semiconductor light emitting devices, in practice. It is thought that one of causes of the aforesaid problems encountered with the ultraviolet semiconductor light emitting devices is that it is not always possible to accomplish the crystal growth. In cases where the light emitting device is to be produced with the material system described above, in order for the light having a short wavelength to be produced, it is necessary that the Al quantity in the AlGaN mixed crystal or the AlGaInN mixed crystal be set to be large. However, in cases where the Al quantity in the AlGaN mixed crystal or the AlGaInN mixed crystal is set to be large, crystal defects are apt to increase, and it is not always possible to achieve conversion into a p-type. Therefore, limitation is imposed upon the increase in Al quantity in the AlGaN mixed crystal or the AlGaInN mixed crystal.

Also, AlGaN type semiconductor light emitting devices, in which an MnO base plate or an SiC base plate is used as the base plate, have been proposed in, for example, Japanese Unexamined Patent Publication Nos. 1(1989)-017484 and 5(1993)-206513. However, even though the kind of the base plate is altered, in order for the light having a short wavelength to be produced, it is still necessary that the Al quantity in the AlGaN mixed crystal or the AlGaInN mixed crystal be set to be large. Therefore, with the techniques proposed in, for example, Japanese Unexamined Patent Publication Nos. 1(1989)-017484 and 5(1993)-206513, the problems described above are not capable of being solved.

SUMMARY OF THE INVENTION

The primary object of the present invention is to provide a semiconductor layer, which is appropriate for use in a short-wavelength semiconductor light emitting device capable of producing light having a short wavelength falling within the range of 190 nm to 300 nm.

Another object of the present invention is to provide a process for forming the semiconductor layer.

A further object of the present invention is to provide a semiconductor light emitting device, which is provided with the semiconductor layer.

The term "wavelength of produced light" as used herein means the oscillation wavelength in the cases of the semiconductor laser, or the center emission wavelength in the cases of the light emitting diode.

The inventors presumed that one of the causes of the aforesaid problems encountered with the AlGaN type semiconductor light emitting devices will be that the Al substance has an activity higher than the activity of other substances and is markedly unstable in the state of the simple substance. Also, the inventors considered that, under composition conditions of a small Al quantity, from the view point of a band gap, there will be a possibility that light having a wavelength falling within the range of 190 nm to 300 nm will be produced. Further, the inventors considered that, in cases where material selection is made such that a plurality of semiconductor layers necessary for constituting the semiconductor light emitting device are capable of being constituted by identical type materials, a short wavelength semiconductor light emitting device having a high practicability will be capable of being accomplished.

The inventors paid particular attention to BN (boron nitride) as a material for short wavelengths and have found that a BAlGaN type material, which is the mixed crystal of BN, AlN, and GaN, is appropriate as the material having the characteristics described above. Also, the inventors have found that a base plate constituted of $BeO$, $TiB_2$, $ScB_2$, $VB_2$, $YB_2$, $MnB_2$, $MgB_2$, $FeB_2$, or $CrB_2$ is appropriate as the base plate, and that a laser assisted metal organic vapor phase epitaxy technique (i.e., a laser assisted MOVPE technique) is appropriate as the film forming technique.

The present invention provides a semiconductor layer, containing, as a principal constituent, a Groups III-V semiconductor compound, which may be represented by the general formula:

$$B_xAl_yGa_zN$$

wherein x represents a number satisfying the condition $0<x<1$, y represents a number satisfying the condition $0 \leq y<1$, and z represents a number satisfying the condition $0<z<1$, with the proviso that $x+y+z=1$, the semiconductor layer having been formed with a laser assisted metalorganic vapor phase epitaxy technique (i.e., a laser assisted MOVPE technique).

With the laser assisted MOVPE technique, while a laser beam is being irradiated to a base plate, at least one kind of a film formation raw material, which contains a metalorganic compound, is supplied in a vapor phase onto the base plate. At least a part of the film formation raw material is thus decomposed, and a film containing the constituent element of the film formation raw material is caused to grow in the vapor phase on the base plate.

The term "principal constituent" as used herein means the constituent contained in a proportion of at least 99 mol %.

As for BN, synthesis of a hexagonal system boron nitride crystal has been reported by, for example, Watanabe et al. of the Substance Material Research Organization. Also, it has been reported by, for example, Watanabe et al. of the Substance Material Research Organization that the hexagonal system boron nitride crystal described above exhibits emission of light having a wavelength of 220 nm by being excited by an electron beam. (The aforesaid report is made in, for example, "Direct-bandgap properties and evidence for ultraviolet lasing of hexagonal boron nitride single crystal," nature materials, Vol. 3, p. 404, 2004.) Also, formation of a BAlN single crystal thin film on a single crystal base plate is reported in, for example, Japanese Patent No. 3716440. However, nothing is described with respect to BAlGaN or BGaN in, for example, "Direct-bandgap properties and evidence for ultraviolet lasing of hexagonal boron nitride single crystal," nature materials, Vol. 3, p. 404, 2004 and Japanese Patent No. 3716440.

The semiconductor layer in accordance with the present invention may be modified such that a boron compound and at least one kind of metalorganic compound are used as the Group-III raw materials, and ammonia is used as the Group-V raw material. Also, the semiconductor layer in accordance with the present invention should preferably be modified such that the semiconductor layer is formed on a base plate selected from the group consisting of a BeO base plate, a $TiB_2$ base plate, an $ScB_2$ base plate, a $VB_2$ base plate, a $YB_2$ base plate, an $MnB_2$ base plate, an $MgB_2$ base plate, an $FeB_2$ base plate, and a $CrB_2$ base plate. Further, since the laser assisted metalorganic vapor phase epitaxy technique is employed, the semiconductor layer in accordance with the present invention may be modified such that the semiconductor layer is formed on the base plate at a film formation temperature of at most 1,200° C.

The present invention also provides a process for forming a semiconductor layer, comprising the steps of:

forming a semiconductor layer on a base plate by use of a laser assisted metal organic vapor phase epitaxy technique, the semiconductor layer containing, as a principal constituent, a Groups III-V semiconductor compound, which may be represented by the general formula:

$B_xAl_yGa_zN$ wherein x represents a number satisfying the condition 0<x<1, y represents a number satisfying the condition 0≦y<1, and z represents a number satisfying the condition 0<z<1, with the proviso that x+y+z=1.

The process for forming a semiconductor layer in accordance with the present invention should preferably be modified such that a laser beam is irradiated to the base plate from at least one direction, such that the laser beam passes just above the base plate and in a direction approximately parallel with a base plate surface of the base plate, supply of film formation raw materials with respect to the base plate is performed, while the laser beam is being thus irradiated to the base plate, and the semiconductor layer is thereby formed.

The term "direction approximately parallel with a base plate surface" as used herein means the direction of irradiation of the laser beam, which direction makes an angle falling within the range of 90±2 degrees with respect to the direction normal to the base plate surface of the base plate.

In such cases, the process for forming a semiconductor layer in accordance with the present invention should more preferably be modified such that the irradiation of the laser beam to the base plate is performed with a laser beam profile, such that a distribution of a laser beam intensity, which distribution is taken in the direction parallel with the base plate surface, is approximately uniform, and such that the distribution of the laser beam intensity, which distribution is taken in the direction normal to the base plate surface, is the distribution approximately represented by the Gaussian distribution, and the laser beam is irradiated to the base plate, such that a peak of the distribution of the laser beam intensity, which distribution is taken in the direction normal to the base plate surface, is present within the range of at most 2 mm from the base plate surface, which range is taken in the direction normal to the base plate surface.

The present invention further provides a first semiconductor light emitting device, comprising the semiconductor layer in accordance with the present invention.

The present invention still further provides a second semiconductor light emitting device, comprising:

i) a first electrical conduction type semiconductor base plate, ii) a first electrical conduction type electrode, iii) a first electrical conduction type cladding layer, iv) a semiconductor active layer, v) a second electrical conduction type cladding layer, and vi) a second electrical conduction type electrode, the first electrical conduction type electrode, the first electrical conduction type cladding layer, the semiconductor active layer, the second electrical conduction type cladding layer, and the second electrical conduction type electrode being formed on the first electrical conduction type semiconductor base plate, the first electrical conduction type semiconductor base plate being a base plate selected from the group consisting of a BeO base plate, a $TiB_2$ base plate, a $ScB_2$ base plate, a $VB_2$ base plate, a $YB_2$ base plate, an $MnB_2$ base plate, an $MgB_2$ base plate, an $FeB_2$ base plate, and a $CrB_2$ base plate, each of the first electrical conduction type cladding layer and the second electrical conduction type cladding layer being a BAlGaN layer, which has been formed by use of a laser assisted metal organic vapor phase epitaxy technique, the semiconductor active layer being constituted of a single-layer or laminate structure containing a BGaN layer and/or a BAlGaN layer, which has been formed by use of a laser assisted metalorganic vapor phase epitaxy technique.

The term "first electrical conduction type" as used herein means either one of a p-type and an n-type, and the term "second electrical conduction type" as used herein means the other type. Thus the term "first electrical conduction type" and the term "second electrical conduction type" as used herein means the different electrical conduction types.

The second semiconductor light emitting device in accordance with the present invention may be constituted such that the first electrical conduction type electrode and the second electrical conduction type electrode are formed on different surfaces of the semiconductor base plate. Alternatively, the second semiconductor light emitting device in accordance with the present invention may be constituted such that the first electrical conduction type electrode and the second electrical conduction type electrode are formed on an identical surface of the semiconductor base plate.

The second semiconductor light emitting device in accordance with the present invention should preferably be modified such that the semiconductor active layer is a multiple quantum well active layer, which is constituted of a laminate structure comprising BGaN quantum well layers and at least one barrier layer selected from the group consisting of a BGaN barrier layer and a BAlGaN barrier layer.

The second semiconductor light emitting device in accordance with the present invention should preferably be modified such that the first electrical conduction type cladding layer and the second electrical conduction type cladding layer are approximately lattice matched with the first electrical conduction type semiconductor base plate.

The term "approximate lattice matching" as used herein means that the two layers satisfy the condition of (a1−a2)/a1<3%, wherein a1 represents the lattice constant of one of the two layers, and a2 represents the lattice constant of the other layer.

In accordance with the present invention, it is possible to furnish a semiconductor laser, which has the device constitution of the second semiconductor light emitting device in accordance with the present invention, and which is capable of producing a laser beam having a wavelength falling within the range of 210 nm to 280 nm, or a light emitting diode, which has the device constitution of the second semiconductor light emitting device in accordance with the present invention, and which has a center emission wavelength falling within the range of 190 nm to 300 nm.

The semiconductor layer in accordance with the present invention is characterized by containing, as the principal constituent, the Groups III-V semiconductor compound, which may be represented by the general formula:

$B_xAl_yGa_zN$ wherein x represents the number satisfying the condition 0<x<1, y represents the number satisfying the condition 0≦y<1, and z represents the number satisfying the condition 0<z<1, with the proviso that x+y+z=1, the semiconductor layer having been formed with the laser assisted metal organic vapor phase epitaxy technique.

From the view point of the band gap, the semiconductor layer in accordance with the present invention is capable of emitting light having a wavelength falling within the range of 190 nm to 300 nm and is appropriate for use in a short-wavelength semiconductor light emitting device. The term "wavelength of produced light" as used herein means the oscillation wavelength in the cases of the semiconductor laser, or the center emission wavelength in the cases of the light emitting diode.

With the semiconductor layer in accordance with the present invention, under the conditions of production of light having a short wavelength, the Al quantity is capable of being kept smaller than in the AlGaN type material, which has widely been used as the material for the semiconductor light emitting devices. Therefore, it is considered that, with the semiconductor layer in accordance with the present invention, it is possible to eliminate the problems with regard to the increase in crystal defect and difficulty of conversion into the p-type due to the increase in Al quantity, which problems are thought to constitute one of causes of obstruction of production of light having a short wavelength with the AlGaN type material. It is thus considered that, with the semiconductor layer in accordance with the present invention, it is possible to obtain the semiconductor layer having good crystalline characteristics, good semiconductor characteristics, and the like.

The semiconductor layer in accordance with the present invention should preferably be modified such that the semiconductor layer is formed on the base plate selected from the group consisting of the BeO base plate, the $TiB_2$ base plate, the $ScB_2$ base plate, the $VB_2$ base plate, the $YB_2$ base plate, the $MnB_2$ base plate, the $MgB_2$ base plate, the $FeB_2$ base plate, and the $CrB_2$ base plate. Also, since the laser assisted metalorganic vapor phase epitaxy technique is employed, the semiconductor layer in accordance with the present invention, which has good crystalline characteristics, is capable of being formed on the base plate at a film formation temperature of at most 1,200° C.

With the semiconductor layer in accordance with the present invention, the lattice constant becomes smaller than the lattice constant of conventional semiconductor layers utilizing the GaN base plate. Specifically, with the semiconductor layer in accordance with the present invention, each interatomic distance become short, and therefore strong bond force is capable of being obtained. Accordingly, the semiconductor layer in accordance with the present invention has a high resistance to breakage. Also, in cases where the semiconductor layer in accordance with the present invention is taken as a film simple substance, the semiconductor layer in accordance with the present invention is capable of a high resistance to wear. Further, in cases where the semiconductor layer in accordance with the present invention is utilized in light emitting devices, light receiving devices, and electronic devices, the effects of enhancing the reliability of the devices are capable of being obtained.

In cases where the semiconductor light emitting device is constituted by use of the semiconductor layer in accordance with the present invention, it is possible to furnish a short-wavelength semiconductor light emitting device, which is capable of producing light having a short wavelength falling within the range of 190 nm to 300 nm. In accordance with the present invention, it is possible to furnish a short-wavelength semiconductor light emitting device, which has a high efficiency and good light emission characteristics.

The short-wavelength semiconductor light emitting device in accordance with the present invention is capable of being utilized as a novel short-wavelength light source. The short-wavelength semiconductor light emitting device in accordance with the present invention is capable of being kept smaller in size than the conventional ultraviolet light source, such as a mercury vapor lamp. The short-wavelength semiconductor light emitting device in accordance with the present invention is capable of being utilized in a wide variety of use applications, such as various kinds of sterilization light sources, light sources for visible light illumination combined with fluorescent substances, exposure light sources for photoresists, and the like, and processing lasers.

BRIEF DESCRIPTION OF THE DRAWINGS

FIG. 3A is a sectional view showing a semiconductor laser, which acts as a first embodiment of the semiconductor light emitting device in accordance with the present invention, FIG. 3B is an enlarged sectional view showing a semiconductor active layer constituting the semiconductor laser of FIG. 3A, and FIG. 4 is a sectional view showing a light emitting diode, which acts as a second embodiment of the semiconductor light emitting device in accordance with the present invention.

DESCRIPTION OF THE PREFERRED EMBODIMENTS

Figure 1:
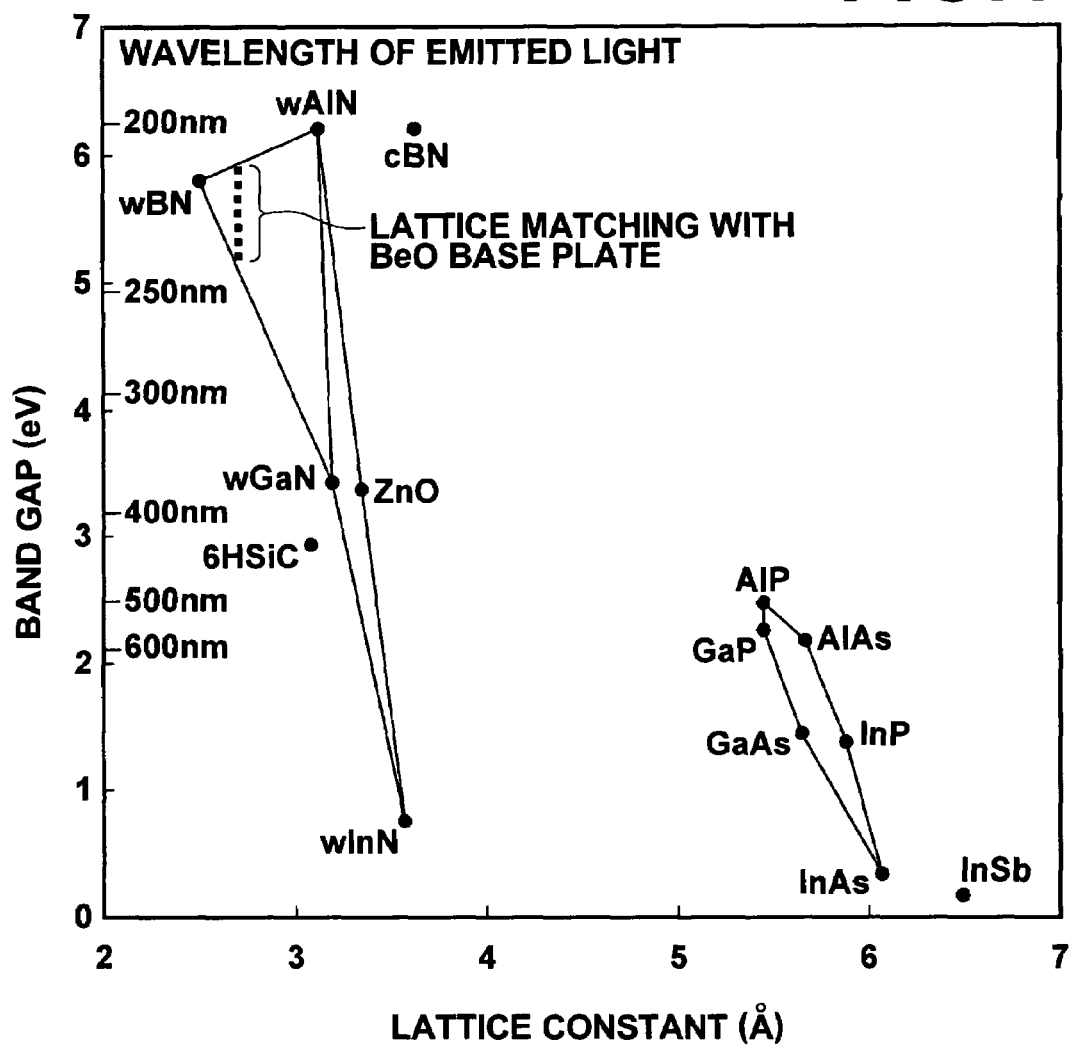
FIG. 1 is a graph showing relationships between lattice constants and band gap energy of Groups III-V semiconductor compounds.

The present invention will hereinbelow be described in further detail with reference to the accompanying drawings.

[Semiconductor Layer and Film Forming Process]

The semiconductor layer in accordance with the present invention is characterized by containing, as the principal constituent, the Groups III-V semiconductor compound, which may be represented by the general formula:

$B_xAl_yGa_zN$ wherein x represents the number satisfying the condition $0<x<1$, y represents the number satisfying the condition $0 \leq y<1$, and z represents the number satisfying the condition $0<z<1$, with the proviso that $x+y+z=1$, the semiconductor layer having been formed with the laser assisted metal organic vapor phase epitaxy technique (i.e., the laser assisted MOVPE technique).

The semiconductor layer in accordance with the present invention may be a doped semiconductor layer, which has been doped with a p-type dopant or an n-type dopant. Alternatively, the semiconductor layer in accordance with the present invention may be a non-doped semiconductor layer.

With the semiconductor layer in accordance with the present invention, under the conditions of production of light having a short wavelength, the Al quantity is capable of being kept smaller than in the AlGaN type material, which has widely been used as the material for the semiconductor light emitting devices. Therefore, it is considered that, with the semiconductor layer in accordance with the present invention, it is possible to eliminate the problems with regard to the increase in crystal defect and difficulty of conversion into the p-type due to the increase in Al quantity, which problems are thought to constitute one of causes of obstruction of production of light having a short wavelength with the AlGaN type material. It is thus considered that, with the semiconductor layer in accordance with the present invention, it is possible to obtain the semiconductor layer having good crystalline characteristics, good semiconductor characteristics, and the like.

Specifically, it is considered that, in order for light having a short wavelength falling within the range of 190 nm to 300 nm to be obtained with an AlGaInN type semiconductor device, it is necessary that the Al quantity in AlGaInN be set at a value falling within the range of 75 mol % to 100 mol %. With the semiconductor layer in accordance with the present invention, the Al quantity in BAlGaN is capable of being set at a value falling within the range of 15 mol % to 30 mol %.

No limitation is imposed upon the kind of the base plate. The inventors have found that the base plate constituted of BeO, $TiB_2$, $ScB_2$, $VB_2$, $YB_2$, $MnB_2$, $MgB_2$, $FeB_2$, or $CrB_2$ is appropriate as the base plate. As the BeO base plate, an n-type BeO (0001) base plate is preferable.

As for the BeO base plate, a hexagonal system single crystal base plate having good quality has been used in practice and is available easily. Also, BeO has a lattice constant of 2.698 Å for the "a" axis. Therefore, the BeO base plate and the semiconductor layer in accordance with the present invention are capable of being appropriately lattice matched with each other. Further, BeO has a band gap of 11.2 eV and is the material transparent with respect to ultraviolet light. Therefore, the BeO base plate enables light to be taken out from the base plate side and is appropriate for use applications, such as light emitting diodes.

FIG. 1 is a graph showing relationships between lattice constants and band gap energy of Groups III-V semiconductor compounds. As illustrated in FIG. 1, in cases where the BAlGaN type material is caused to grow on the BeO base plate, the band gap is capable of being controlled within the range of approximately 5 eV to approximately 6 eV. The band gap falling within the aforesaid range corresponds to a wavelength of the produced light falling within the range of approximately 210 nm to approximately 250 nm.

From the results of studies made by the inventors, it has also been found that the base plate constituted of $TiB_2$, $ScB_2$, $VB_2$, $YB_2$, $MnB_2$, $MgB_2$, $FeB_2$, or $CrB_2$ is the material capable of constituting the crystal system having a lattice constant falling within the range of 2.5 Å to 3.0 Å and is capable of being used appropriately as the base plate for the semiconductor layer in accordance with the present invention.

As described above, BeO has a lattice constant of 2.698 Å for the "a" axis. Thus, as for BeO, the inter-atomic distance is short, and bond energy is high. In cases where the BAlGaN type material is to be caused to grow on the base plate described above, high energy will be required. Therefore, it is thought that processing for causing the BAlGaN type material to grow on the base plate described above will be difficult to accomplish with the ordinary film forming technique.

The inventors have found that, in cases where the laser assisted metal organic vapor phase epitaxy technique (i.e., the laser assisted MOVPE technique) is employed, the semiconductor layer in accordance with the present invention, which has good crystalline characteristics, is capable of being formed on the base plate described above.

The semiconductor layer in accordance with the present invention is capable of being formed with a process, in which the boron compound (preferably, a boron hydride compound) and at least one kind of the metal organic compound are used as the Group-III raw materials, and ammonia is used as the Group-V raw material. In such cases, the Group-III raw materials should preferably be, for example, $B_2H_6$ (diborane)/ TMA (trimethylaluminum)/TMG (trimethylgallium) or TEG (triethylgallium).

In cases where a BAlGaN layer or a BGaN layer is to be caused to grow by use of the ordinary MOVPE technique, the raw materials described above and, when necessary, a carrier gas, such as a hydrogen gas or a nitrogen gas, are supplied onto the base plate. In such cases, it is considered that the film formation be performed under the conditions of the base plate temperature of approximately 1,500° C. It is thought that, in order for energy necessary for setting boron and aluminum in a highly excited radical state to be obtained, the temperature of as high as approximately 1,500° C. is required.

However, in cases where the base plate temperature is set at a high temperature of at least 1,200° C. in the vapor phase growth technique, a gas convection phenomenon is not capable of being neglected, and a turbulent flow of the raw material gas occurs within a reaction tube. Therefore, there is the risk that the supply of the raw materials onto the base plate will be obstructed.

The inventors have found that, in cases where the laser assisted MOVPE technique, with which the metal organic vapor phase growth is performed while the laser beam is being irradiated to the base plate, is employed, the excitation of boron and aluminum to the high energy state is capable of being promoted, and the BAlGaN layer or the BGaN layer is capable of being caused to grow at a temperature lower than with the ordinary MOVPE technique. Specifically, in cases where the laser assisted MOVPE technique is employed, the semiconductor layer in accordance with the present invention is capable of being formed at a film formation temperature of at most 1,200° C., at which the convection of the raw material gas is not apt to occur. It is also possible to form the semiconductor layer in accordance with the present invention at a film formation temperature of at most 1,000° C.

Also, the inventors consider that the migration at the time of the crystal growth on the base plate constituted of BeO, $TiB_2$, $ScB_2$, $VB_2$, $YB_2$, $MnB_2$, $MgB_2$, $FeB_2$, or $CrB_2$ is promoted by photon energy of the laser beam, and the crystallization at a stabler site occurs.

In cases where the laser assisted MOVPE technique is employed, by virtue of the effects described above, the semiconductor layer in accordance with the present invention, which has good crystalline characteristics, is capable of being formed on the base plate described above.

Figure 2A:
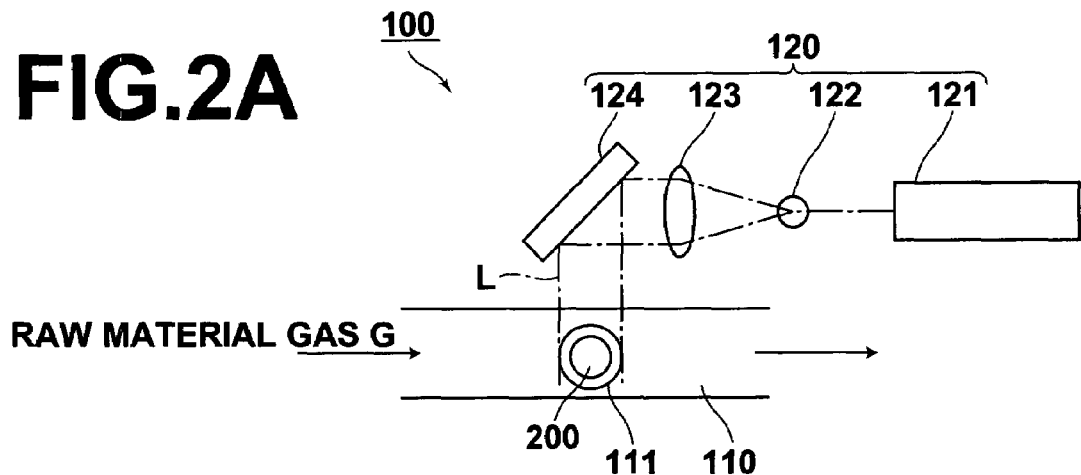
FIG. 2A is a schematic plan view showing a film forming apparatus, which is appropriate for use in film formation of a semiconductor layer in accordance with the present invention.
Figure 2B:
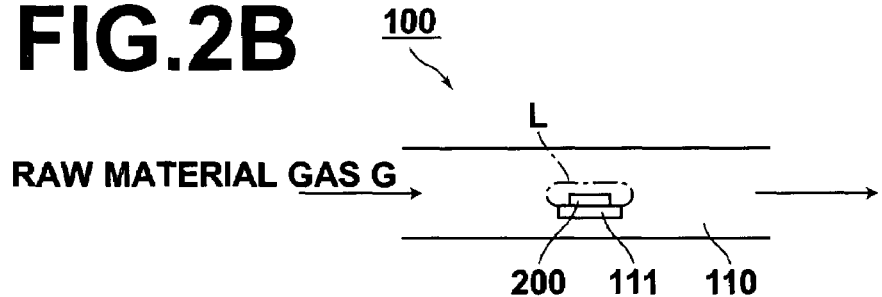
FIG. 2B is a schematic side view showing the film forming apparatus of FIG. 2A.

An example of a laser assisted MOVPE apparatus, which is appropriate for use in the film formation of the semiconductor layer in accordance with the present invention, will be described hereinbelow with reference to FIGS. 2A and 2B. FIG. 2A is a schematic plan view showing a film forming apparatus, which is appropriate for use in film formation of a semiconductor layer in accordance with the present invention. FIG. 2B is a schematic side view showing the film forming apparatus of FIG. 2A.

With reference to FIGS. 2A and 2B, a film forming apparatus 100 comprises a reaction tube 110, which is constituted such that at least a part for allowing the passage of a laser beam L has light transmissivity. The film forming apparatus 100 also comprises a laser beam irradiating optical system 120 for irradiating the laser beam L into the reaction tube 110. The laser beam L may be a continuous laser beam, typically a carbon dioxide laser beam. Alternatively, the laser beam L may be a pulsed laser beam, typically an excimer laser beam.

A receptor 111, which is made from carbon, or the like, and on which a base plate 200. (i.e., the base plate constituted of BeO, $TiB_2$, $ScB_2$, $VB_2$, $YB_2$, $MnB_2$, $MgB_2$, $FeB_2$, or $CrB_2$) is supported, is located within the reaction tube 110. In the example illustrated in FIGS. 2A and 2B, the receptor 111 and the base plate 200 have circular disk-like shapes. The receptor 111 is capable of being heated to a desired temperature by a heater (not shown), and the base plate 200 is thus capable of being heated to the desired temperature. As described above, in accordance with the present invention, the film formation is capable of being performed at a film formation temperature (a base plate temperature) of at most 1,200° C.

A raw material gas G, which contains the Group-III raw materials (e.g., $B_2H_6$/TMA/TEG), the Group-V raw material (e.g., ammonia), and, when necessary, a carrier gas, such as a hydrogen gas, is introduced into the reaction tube 110.

The laser beam irradiating optical system 120 comprises a laser beam source 121. The laser beam irradiating optical system 120 also comprises an enlarging lens 122 for enlarging the beam diameter of the laser beam having been radiated out from the laser beam source 121. The laser beam irradiating optical system 120 further comprises a collimator lens 123 for collimating the laser beam having been radiated out from the enlarging lens 122. The laser beam irradiating optical system 120 still further comprises a reflection mirror 124 for reflecting the laser beam, which has been radiated out from the collimator lens 123, toward the side of the base plate 200. It is sufficient for the laser beam irradiating optical system 120 to irradiate the laser beam L to the base plate 200, and the optical system may be designed in various other ways.

No limitation is imposed upon the laser beam source 121. However, the laser beam source 121 should preferably be an ultraviolet laser, which is capable of producing the laser beam having a wavelength falling within the range of 150 nm to 310 nm. The ultraviolet laser is advantageous in that photon energy is high, and in that the raw material decomposition promoting effect is expected to be large in view of the bond energy. Examples of the ultraviolet lasers include excimer lasers (such as ArF, KrF, XeCl, XeF, or $F_2$) and ultraviolet solid lasers.

The location of the laser beam irradiating optical system 120 is designed such that the laser beam L passes just above the base plate 200 and from one direction to the direction approximately parallel with the base plate surface of the base plate 200. Also, the enlarging optical system, or the like, of the laser beam irradiating optical system 120 is designed such that the laser beam L may be irradiated to the entire area of the surface of the base plate 200.

The direction of irradiation of the laser beam L may be designed arbitrarily. The laser beam L may be irradiated from a direction normal to the base plate surface or from a direction oblique with respect to the base plate surface. However, in cases where the laser beam L is irradiated from the direction normal to the base plate surface or from the direction oblique with respect to the base plate surface, there will be the risk, under certain conditions of irradiation, that the laser beam L will strongly impinge upon the base plate surface and will damage the base plate 200 or the growing crystal.

Therefore, as in the example illustrated in FIGS. 2A and 2B, the laser beam L should most preferably be irradiated to the base plate 200, such that the laser beam L may pass just above the base plate 200 and in the direction approximately parallel with the base plate surface of the base plate 200. In cases where the laser beam L is irradiated in the direction described above, damage to the base plate 200 is capable of being suppressed, and decomposition and elimination of the growing crystal by the laser beam L are capable of being suppressed.

The irradiation of the laser beam L to the base plate 200 may be performed with the laser beam profile, such that the distribution of the laser beam intensity, which distribution is taken in the direction parallel with the base plate surface, is approximately uniform, and such that the distribution of the laser beam intensity, which distribution is taken in the direction normal to the base plate surface, is the distribution approximately represented by the Gaussian distribution. In cases where the irradiation of the laser beam L to the base plate 200 is performed with the laser beam profile described above, approximately the entire area of the surface of the base plate 200 is capable of being processed approximately uniformly, and a film having uniform quality is capable of being caused to grow.

Figure 2C:
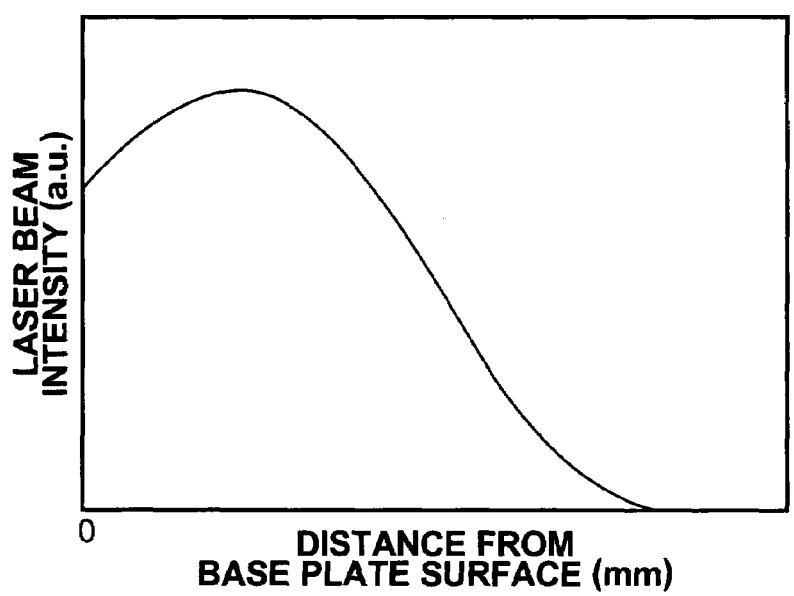
FIG. 2C is a graph showing an example of a laser beam profile.

FIG. 2C is a graph showing an example of a distribution of the laser beam intensity of the laser beam L, which distribution is taken in the direction normal to the base plate surface.

The laser beam L should preferably be irradiated to the base plate 200, such that the peak of the distribution of the laser beam intensity, which distribution is taken in the direction normal to the base plate surface, is present within the range of at most 2 mm from the base plate surface, which range is taken in the direction normal to the base plate surface.

In cases where the irradiation of the laser beam L is performed with the laser beam profile described above, the laser beam intensity of the laser beam L passing just above the base plate 200 is capable of being kept high, and the reaction for the vapor phase growth on the base plate 200 is capable of being performed efficiently.

Only one laser beam source 121 may be utilized. Alternatively, a plurality of laser beam sources 121, 121, . . . may be utilized. In cases where the number of the laser beam sources 121, 121, . . . is set to be large, it is expected that the total laser beam quantity irradiated to the base plate 200 is capable of being set to be large, and that, as for certain kinds of the raw materials, the raw material decomposition is capable of being promoted even further.

In cases where the plurality of the laser beam sources 121, 121, . . . are utilized, the laser beams L, L, . . . having been produced by the plurality of the laser beam sources 121, 121, . . . may be irradiated to the base plate 200 in independent manners from different directions with respect to the base plate 200. Alternatively, the laser beams L, L, . . . having been produced by the plurality of the laser beam sources 121, 121, . . . may be combined together and irradiated as the combined laser beam to the base plate 200.

Also, in cases where the plurality of the laser beam sources 121, 121, . . . are utilized, the laser beams L, L, . . . having been produced by the plurality of the laser beam sources 121, 121, . . . may have an identical wavelength. Alternatively, the laser beams L, L, . . . having been produced by the plurality of the laser beam sources 121, 121, . . . may have different wavelengths.

In cases where, for example, multiple kinds of film formation raw materials are used, the plurality of the laser beam sources 121, 121, . . . capable of producing the laser beams L, L, . . . having different wavelengths should preferably be used. Also, in such cases, the laser beams L, L, . . . having the different wavelengths should preferably be irradiated in the independent manners to the base plate 200. Alternatively, in such cases, the laser beams L, L, . . . having the different wavelengths should preferably be combined together and irradiated as the combined laser beam to the base plate 200. In cases where the multiple kinds of the film formation raw materials varying in bond energy are used, the wavelengths of the laser beam s L, L, . . . produced by the plurality of the laser beam sources 121, 121, . . . should preferably be varied in accordance with the bond energy of the multiple kinds of the film formation raw materials. In such cases, the multiple kinds of the film formation raw materials are capable of being decomposed efficiently.

In cases where the film forming apparatus 100 having the constitution described above is used, the metal organic vapor phase growth is capable of being performed, while the laser beam L (preferably the ultraviolet laser beam) is being irradiated to the base plate 200, and the BAlGaN layer or the BGaN layer is capable of being caused to grow at a film formation temperature of at most 1,200° C., at which the convection of the raw material gas is not apt to occur.

As described above, the semiconductor layer in accordance with the present invention is characterized by containing, as the principal constituent, the Groups III-V semiconductor compound, which may be represented by the general formula:

wherein x represents the number satisfying the condition $0<x<1$, y represents the number satisfying the condition $0 \leq y<1$, and z represents the number satisfying the condition $0<z<1$, with the proviso that $x+y+z=1$, the semiconductor layer having been formed with the laser assisted metal organic vapor phase epitaxy technique.

From the view point of the band gap, the semiconductor layer in accordance with the present invention is capable of emitting light having a wavelength falling within the range of 190 nm to 300 nm and is appropriate for use in a short-wavelength semiconductor light emitting device. (The term "wavelength of produced light" as used herein means the oscillation wavelength in the cases of the semiconductor laser, or the center emission wavelength in the cases of the light emitting diode.)

With the semiconductor layer in accordance with the present invention, under the conditions of production of light having a short wavelength, the Al quantity is capable of being kept smaller than in the AlGaN type material. Therefore, it is considered that, with the semiconductor layer in accordance with the present invention, it is possible to obtain the semiconductor layer having good crystalline characteristics, good semiconductor characteristics, and the like.

The semiconductor layer in accordance with the present invention should preferably be formed on the base plate constituted of BeO, $TiB_2$, $ScB_2$, $VB_2$, $YB_2$, $MnB_2$, $MgB_2$, $FeB_2$, or $CrB_2$. Also, since the laser assisted metalorganic vapor phase epitaxy technique is employed, the semiconductor layer in accordance with the present invention, which has good crystalline characteristics, is capable of being formed on the base plate at a film formation temperature of at most 1,200° C.

First Embodiment of Semiconductor Light Emitting Device (Semiconductor Laser)

A semiconductor laser, which acts as a first embodiment of the semiconductor light emitting device in accordance with the present invention, will be described hereinbelow with reference to FIGS. 3A and 3B. FIG. 3A is a sectional view showing a semiconductor laser, which acts as a first embodiment of the semiconductor light emitting device in accordance with the present invention. FIG. 3B is an enlarged sectional view showing a semiconductor active layer constituting the semiconductor laser of FIG. 3A.

With reference to FIG. 3A, this embodiment of a semiconductor laser (a semiconductor light emitting device) 1 comprises an n-type (i.e., a first electrical conduction type) semiconductor base plate 11. The semiconductor laser 1 also comprises an n-type cladding layer 12, a non-doped lower light guiding layer 13, a semiconductor active layer 14, a non-doped upper light guiding layer 15, a p-type (i.e., a second electrical conduction type) cladding layer 16, a p-type contact layer 17, an insulating film 20, and a p-type electrode 21, which are overlaid on a top surface of the n-type semiconductor base plate 11 and in this order from the side of the n-type semiconductor base plate 11. This embodiment of the semiconductor laser 1 thus has the laminate structure.

A left end region (in FIG. 3A) of the laminate of the n-type cladding layer 12 to the p-type electrode 21 has been etched with dry etching processing until the n-type cladding layer 12 is exposed to the exterior. An n-type electrode 22 is formed in the region, at which the n-type cladding layer 12 is exposed to the exterior by the etching processing. The n-type electrode 22 is formed such that the n-type electrode 22 may be in contact with only the n-type cladding layer 12 and may not be in contact with the other layers.

In this embodiment, as illustrated in FIG. 3B, the semiconductor active layer 14 is a multiple quantum well active layer having a laminate structure comprising quantum well layers 14A, 14A, 14A and barrier layers 14B, 14B, which are overlaid alternately.

In this embodiment of the semiconductor laser 1, the insulating film 20 is formed in a pattern having an aperture 20A. Specifically, this embodiment of the semiconductor laser 1 has a striped structure, in which an electric current flows selectively only through the opening region of the aperture 20A of the insulating film 20.

Design examples of the composition of the n-type semiconductor base plate 11, the composition of each of the layers, and the thickness of each of the layers will be described below.

n-Type Semiconductor Base Plate 11:
  n-BeO (0001) base plate n-Type Cladding Layer 12:
  n-BAlGaN layer (thickness: 1.2 μm)

Non-Doped Lower Light Guiding Layer 13:
  BAlGaN layer (thickness: 0.1 μm)

Semiconductor Active Layer 14:
  A laminate structure comprising BGaN quantum well layers (thickness of each layer: 3 nm, a total of three layers) and BAlGaN barrier layers (thickness of each layer: 5 nm, a total of two layers), which are overlaid alternately Non-Doped Upper Light Guiding Layer 15:
  BAlGaN layer (thickness: 0.1 μm)

p-Type Cladding Layer 16:
  p-BAlGaN layer (thickness: 1.2 μm)

p-Type Contact Layer 17:
  p-BGaN layer (thickness: 0.2 μm)

Insulating Film 20:
  $SiO_2$

As the n-type semiconductor base plate 11, it is also possible to use the base plate constituted of $n-TiB_2$, $n-ScB_2$, $n-VB_2$, $n-YB_2$, $n-MnB_2$, $n-MgB_2$, $n-FeB_2$, or $n-CrB_2$.

In this embodiment, the layer compositions are adjusted such that the semiconductor layers ranging from the n-type cladding layer 12 to the p-type contact layer 17 are approximately lattice matched with the n-type semiconductor base plate 11.

In lieu of the layer constitution of the semiconductor active layer 14, the semiconductor active layer 14 may have a laminate structure comprising BGaN strained quantum well layers and BGaN barrier layers, which are overlaid alternately.

In this embodiment, each of the semiconductor layers ranging from the n-type cladding layer 12 to the p-type contact layer 17 is the semiconductor layer in accordance with the present invention, which contains, as the principal constituent, the Groups III-V semiconductor compound, which may be represented by the general formula:

$B_xAl_yGa_zN$ wherein x represents the number satisfying the condition $0<x<1$, y represents the number satisfying the condition $0 \leq y<1$, and z represents the number satisfying the condition $0<z<1$, with the proviso that $x+y+z=1$. Also, each of the semiconductor layers ranging from the n-type cladding layer 12 to the p-type contact layer 17 has been formed with the laser assisted MOVPE technique. Each of the semiconductor layers ranging from the n-type cladding layer 12 to the p-type contact layer 17, which has been formed with the laser assisted MOVPE technique, has good crystalline characteristics.

This embodiment of the semiconductor laser 1 is constituted in the manner described above.

This embodiment of the semiconductor laser 1 is the BAlGaN type semiconductor laser, in which each of the semiconductor layers ranging from the n-type cladding layer 12 to the p-type contact layer 17 is the BAlGaN layer or the BGaN layer.

With the constitution of this embodiment, it is possible to furnish the short-wavelength semiconductor laser, which is capable of producing the laser beam having a wavelength falling within the range of 210 nm to 280 nm. In accordance with the present invention, it is possible to furnish the short-wavelength semiconductor laser, which has a high efficiency and good light emission characteristics. (Reference may be made to Example 1, which will be described later.)

Second Embodiment of Semiconductor Light Emitting Device (Light Emitting Diode)

A light emitting diode, which acts as a second embodiment of the semiconductor light emitting device in accordance with the present invention, will be described hereinbelow with reference to FIG. 4. FIG. 4 is a sectional view showing a light emitting diode, which acts as a second embodiment of the semiconductor light emitting device in accordance with the present invention. In FIG. 4, similar elements are numbered with the same reference numerals with respect to FIG. 3A.

With reference to FIG. 4, this embodiment of a light emitting diode (a semiconductor light emitting device) 2 comprises the n-type (i.e., the first electrical conduction type) semiconductor base plate 11. The light emitting diode 2 also comprises the n-type cladding layer 12, the non-doped lower light guiding layer 13, the semiconductor active layer 14, the non-doped upper light guiding layer 15, the p-type (i.e., the second electrical conduction type) cladding layer 16, the p-type contact layer 17, and the p-type electrode 21, which are overlaid on the top surface of the n-type semiconductor base plate 11 and in this order from the side of the n-type semiconductor base plate 11. This embodiment of the light emitting diode 2 thus has the laminate structure.

In this embodiment of the light emitting diode 2, the left end region (in FIG. 4) of the laminate of the n-type cladding layer 12 to the p-type electrode 21 has been etched with the dry etching processing until the n-type cladding layer 12 is exposed to the exterior. Also, the n-type electrode 22 is formed in the region, at which the n-type cladding layer 12 is exposed to the exterior by the etching processing. The n-type electrode 22 is formed such that the n-type electrode 22 may be in contact with only the n-type cladding layer 12 and may not be in contact with the other layers.

This embodiment of the light emitting diode 2 has the constitution, in which the light is taken out from the side of the n-type semiconductor base plate 11 to the exterior.

In this embodiment, though not shown, the semiconductor active layer 14 is the multiple quantum well active layer having the laminate structure comprising the quantum well layers 14A, 14A, 14A and the barrier layers 14B, 14B, which are overlaid alternately. (Reference may be made to FIG. 3B.)

Design examples of the composition of the n-type semiconductor base plate 11, the composition of each of the layers, and the thickness of each of the layers will be described below.

n-Type Semiconductor Base Plate 11:

n-BeO (0001) base plate n-Type Cladding Layer 12:

n-BAlGaN layer (thickness: 3 μm)

Non-Doped Lower Light Guiding Layer 13:

BAlGaN layer (thickness: 0.2 μm)

Semiconductor Active Layer 14:

A laminate structure comprising BGaN quantum well layers (thickness of each layer: 2.6 nm, a total of five layers) and BAlGaN barrier layers (thickness of each layer: 4 nm, a total of four layers), which are overlaid alternately Non-Doped Upper Light Guiding Layer 15:

BAlGaN layer (thickness: 0.2 μm)

p-Type Cladding Layer 16:

p-BAlGaN layer (thickness: 3 μm)

p-Type Contact Layer 17:

p-BGaN layer (thickness: 0.2 μm)

As the n-type semiconductor base plate 11, it is also possible to use the base plate constituted of n-TiB$_2$, n-ScB$_2$, n-VB$_2$, n-YB$_2$, n-MnB$_2$, n-MgB$_2$, n-FeB$_2$, or n-CrB$_2$.

In this embodiment, the layer compositions are adjusted such that the semiconductor layers ranging from the n-type cladding layer 12 to the p-type contact layer 17 are approximately lattice matched with the n-type semiconductor base plate 11.

In this embodiment, each of the semiconductor layers ranging from the n-type cladding layer 12 to the p-type contact layer 17 is the semiconductor layer in accordance with the present invention, which contains, as the principal constituent, the Groups III-V semiconductor compound, which may be represented by the general formula:

$$B_xAl_yGa_zN$$

wherein x represents the number satisfying the condition 0<x<1, y represents the number satisfying the condition 0≦y<1, and z represents the number satisfying the condition 0<z<1, with the proviso that x+y+z=1. Also, each of the semiconductor layers ranging from the n-type cladding layer 12 to the p-type contact layer 17 has been formed with the laser assisted MOVPE technique. Each of the semiconductor layers ranging from the n-type cladding layer 12 to the p-type contact layer 17, which has been formed with the laser assisted MOVPE technique, has good crystalline characteristics.

This embodiment of the light emitting diode 2 is constituted in the manner described above.

This embodiment of the light emitting diode 2 is the BAlGaN type light emitting diode, in which each of the semiconductor layers ranging from the n-type cladding layer 12 to the p-type contact layer 17 is the BAlGaN layer or the BGaN layer.

With the constitution of this embodiment, it is possible to furnish the light emitting diode, which has the center emission wavelength falling within the range of 190 nm to 300 nm. In accordance with the present invention, it is possible to furnish the short-wavelength light emitting diode, which has a high efficiency and good light emission characteristics. (Reference may be made to Example 2, which will be described later.)

(Examples of Design Modifications)

The present invention is not limited to the embodiments described above, and the device structures may be altered in various other ways.

EXAMPLES

The present invention will further be illustrated by the following non-limitative examples.

Example 1

The semiconductor layers 12 to 17, each of which was the BAlGaN layer or the BGaN layer, were formed on the BeO base plate 11 by use of the film forming apparatus 100 illustrated in FIGS. 2A and 2B. In this manner, the semiconductor laser 1 acting as the first embodiment of the semiconductor light emitting device in accordance with the present invention was produced. The layer compositions and the layer thicknesses were set as described above for the aforesaid embodiment of the semiconductor laser 1.

An ArF excimer laser was used as the laser beam source 121, the output of the laser beam was set at 200 mJ, and the pulse period was set at 100 Hz. The laser beam having been radiated out from the laser beam source 121 was enlarged by the enlarging lens 122 and was then collimated by the collimator lens 123 into a collimated laser beam having a beam diameter of 2 inches. The laser beam L was thus irradiated to the base plate, such that the laser beam L might pass just above the base plate and in the direction parallel with the base plate surface. The irradiation of the laser beam L to the base plate was continued during the period of time from the beginning of the temperature rise of the base plate to the finish of the temperature fall of the base plate. The temperature of the base plate was set at 1,000° C.

As the Group-III raw materials, B$_2$H$_6$/TMA/TEG were used. Also, as the Group-V raw material, ammonia was used. A hydrogen gas was introduced as a carrier gas into the reaction tube 110. As an n-type dopant source, SiH$_4$ (silane) was used. As a p-type dopant source, DEZ (diethylzinc) was used. The pressure in the reaction tube 110 was set at 40 kPa.

After the p-type contact layer 17 was formed, the SiO$_2$ insulating film 20 was formed in a predetermined pattern. The p-type electrode 21 was then formed with vacuum evaporation processing and heat treatment. Thereafter, a left end region (in FIG. 3A) of the laminate of the n-type cladding layer 12 to the p-type electrode 21 was etched with dry etching processing until the n-type cladding layer 12 was exposed to the exterior. The n-type electrode 22 was then formed in the region, at which the n-type cladding layer 12 had been exposed to the exterior by the etching processing, with the vacuum evaporation processing and the heat treatment. The base plate 11 was then polished until the entire thickness of the device became equal to approximately 100 μm. In this manner, the semiconductor laser 1 was obtained.

The stripe width of the semiconductor laser 1 was set at 5 μm, and the resonator length was set at 300 μm. A dielectric multi-layer coating film having a reflectivity of 30% was formed on a front end face of the device. Also, a dielectric multi-layer coating film having a reflectivity of 90% was formed on a rear end face of the device.

The device having thus been obtained was mounted with a junction down technique on a copper heat sink of a mounting base plate. The obtained device exhibited an external quantum efficiency of 10% and thus had a high efficiency. The wavelength of the produced laser beam was 240 nm at the room temperature.

Example 2

The light emitting diode 2 acting as the second embodiment of the semiconductor light emitting device in accordance with the present invention was produced in the same manner as that in Example 1. The layer compositions and the layer thicknesses were set as described above for the aforesaid embodiment of the light emitting diode 2. The side of the p-type electrode 21 of the obtained device was mounted on an iron heat sink of a mounting base plate, such that the light might be taken out from the side of the n-type semiconductor base plate 11. The obtained device exhibited a light emission efficiency of 20% and thus had a high efficiency. The center emission wavelength was 250 nm at the room temperature.

INDUSTRIAL APPLICABILITY

The techniques in accordance with the present invention are capable of being applied appropriately to semiconductor light emitting devices, such as semiconductor lasers and light emitting diodes.

What is claimed is:

1. A semiconductor light emitting device, comprising:
   i) a first electrical conduction type semiconductor base plate,
   ii) a first electrical conduction type electrode,
   iii) a first electrical conduction type cladding layer,
   iv) a semiconductor active layer,
   v) a second electrical conduction type cladding layer, and
   vi) a second electrical conduction type electrode,
   the first electrical conduction type electrode, the first electrical conduction type cladding layer, the semiconductor active layer, the second electrical conduction type cladding layer, and the second electrical conduction type electrode being formed on the first electrical conduction type semiconductor base plate,
   the first electrical conduction type semiconductor base plate being a base plate selected from the group consisting of a BeO base plate, a $TiB_2$ base plate, a $ScB_2$ base plate, a $VB_2$ base plate, a $YB_2$ base plate, an $MnB_2$ base plate, an $MgB_2$ base plate, an $FeB_2$ base plate, and a $CrB_2$ base plate,
   each of the first electrical conduction type cladding layer and the second electrical conduction type cladding layer being a BAlGaN layer, which has been formed by use of a laser assisted metalorganic vapor phase epitaxy technique,
   the semiconductor active layer being constituted of a single-layer or laminate structure containing a BGaN layer and/or a BAlGaN layer, which has been formed by use of a laser assisted metalorganic vapor phase epitaxy technique.

2. A semiconductor light emitting device as defined in claim 1 wherein the semiconductor active layer is a multiple quantum well active layer, which is constituted of a laminate structure comprising BGaN quantum well layers and at least one barrier layer selected from the group consisting of a BGaN barrier layer and a BAlGaN barrier layer.

3. A semiconductor light emitting device as defined in claim 1 wherein the first electrical conduction type cladding layer and the second electrical conduction type cladding layer are approximately lattice matched with the first electrical conduction type semiconductor base plate.

4. A semiconductor light emitting device as defined in claim 1 wherein the semiconductor light emitting device is a semiconductor laser, which is capable of producing a laser beam having a wavelength falling within the range of 210 nm to 280 nm, or a light emitting diode, which has a center emission wavelength falling within the range of 190 nm to 300 nm.

* * * * *